US008508944B2

(12) United States Patent
Lu

(10) Patent No.: US 8,508,944 B2
(45) Date of Patent: Aug. 13, 2013

(54) POWER SUPPLY DEVICE AND POWER SUPPLY MODULE

(75) Inventor: Shao-Feng Lu, Taoyuan County (TW)

(73) Assignees: FSP Technology Inc., Taoyuan County (TW); 3Y Power Technology (Taiwan), Inc., Taoyuan County (TW)

( * ) Notice: Subject to any disclaimer, the term of this patent is extended or adjusted under 35 U.S.C. 154(b) by 246 days.

(21) Appl. No.: 12/752,125

(22) Filed: Apr. 1, 2010

(65) Prior Publication Data

US 2011/0242774 A1 Oct. 6, 2011

(51) Int. Cl.
*H05K 5/00* (2006.01)

(52) U.S. Cl.
USPC ............................ 361/730; 361/752; 361/810

(58) Field of Classification Search
USPC .................... 361/679.01, 679.02, 679.4, 752, 361/728–732, 796, 800, 807, 809, 810; 174/50.52, 100
See application file for complete search history.

(56) References Cited

U.S. PATENT DOCUMENTS

| | | | | |
|---|---|---|---|---|
| 5,855,707 | A * | 1/1999 | Luettgen | 156/73.5 |
| 6,697,892 | B1 * | 2/2004 | Laity et al. | 710/72 |
| 6,962,499 | B2 * | 11/2005 | Yamamoto et al. | 439/76.2 |
| 6,984,133 | B2 * | 1/2006 | Naitou et al. | 439/76.2 |
| 7,440,262 | B2 * | 10/2008 | Coffey et al. | 361/627 |
| 2005/0148224 | A1 * | 7/2005 | Ootori et al. | 439/179 |
| 2005/0213305 | A1 * | 9/2005 | Martin et al. | 361/714 |
| 2008/0278898 | A1 * | 11/2008 | Huang | 361/683 |

* cited by examiner

*Primary Examiner* — Hung S Bui
(74) *Attorney, Agent, or Firm* — Jianq Chyun IP Office

(57) ABSTRACT

A power supply device including a casing and a power supply module is provided. The casing has an opening. The power supply module includes a frame, a pin base, a plurality of pins and a printed circuit board. The frame is detachably disposed in the casing. The pin base is fixed at the frame and is exposed by the opening. The pins are fixed at the pin base, and first ends of the pins are exposed in the opening. The printed circuit board is disposed in the casing and is electrically connected to second ends of the pins.

10 Claims, 2 Drawing Sheets

POWER SUPPLY DEVICE AND POWER SUPPLY MODULE

BACKGROUND OF THE INVENTION

1. Field of the Invention

The present invention relates to an electronic device. More particularly, the present invention relates to a power supply device and a power supply module.

2. Description of Related Art

With a quick development of electronic technology, power supply devices are generally equipped to various electronic devices for providing power. Generally, the power supply device is mainly used to convert alternating currents (AC) into stable direct currents (DC) required by various electronic devices.

In a conventional power supply device, a pin base is screwed to an outer surface of a casing, and a plurality of pins fixed on the pin base stretch into the casing for electrically connecting a printed circuit board in the casing, so as to electrically connect an outer circuit with the printed circuit board through the pins. However, such deploying method can lead to a difficulty in assembling, and since the pins fixed on the pin base penetrate through the casing to electrically connect the printed circuit board, disassembling of the pins is not easy during reworking.

SUMMARY OF THE INVENTION

The present invention is directed to a power supply device, which is easy to be assembled and disassembled.

The present invention is directed to a power supply module, which is easy to be assembled and disassembled to a power supply device.

The present invention provides a power supply device including a casing and a power supply module. The casing has an opening. The power supply module includes a frame, a pin base, a plurality of pins and a printed circuit board. The frame is detachably assembled in the casing. The pin base is fixed at the frame and is exposed by the opening. The pins are fixed at the pin base, and first ends of the pins are exposed in the opening. The printed circuit board is disposed in the casing and is electrically connected to second ends of the pins.

The present invention provides a power supply module, which is adapted to a power supply device. The power supply device includes a casing having an opening. The power supply module includes a frame, a pin base, a plurality of pins and a printed circuit board. The frame is detachably assembled in the casing. The pin base is fixed at the frame and is exposed by the opening. The pins are fixed at the pin base, and first ends of the pins are exposed in the opening. The printed circuit board is disposed in the casing and is electrically connected to second ends of the pins.

In an embodiment of the present invention, the pins are welded to the printed circuit board.

In an embodiment of the present invention, the power supply module further includes a plurality of wires, and the pins are electrically connected to the printed circuit board through the wires.

In an embodiment of the present invention, the frame is located between the pin base and the printed circuit board and has an opening slot, and the pins penetrate through the opening slot to electrically connect the printed circuit board.

In an embodiment of the present invention, the pin base is inlaid to the opening.

According to the above descriptions, in the power supply device of the present invention, the pin base is fixed at the frame, and the pins fixed to the pin base penetrate through the frame to connect the printed circuit board, and the frame is detachably assembled in the casing. Therefore, by assembling/disassembling the frame to/from the casing, the power supply module including the pin base, the pins, the frame and the printed circuit board can be assembled/separated to/from the casing, so as to improve an assembling/disassembling convenience.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
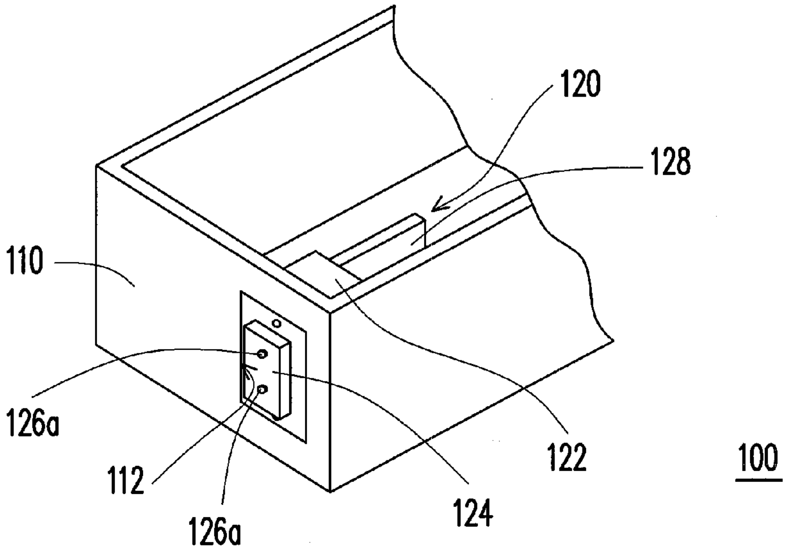
FIG. 1 is a partial three-dimensional view of a power supply device according to an embodiment of the present invention.
Figure 2:
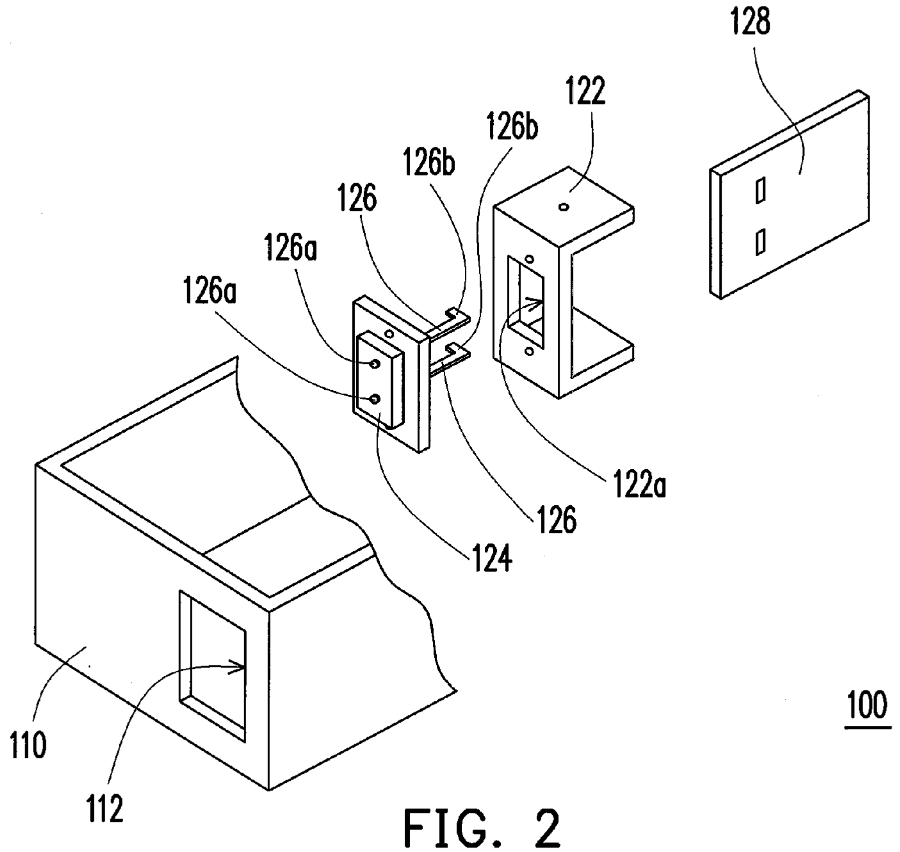
FIG. 2 is an exploded view of a power supply device of FIG. 1.
Figure 3:
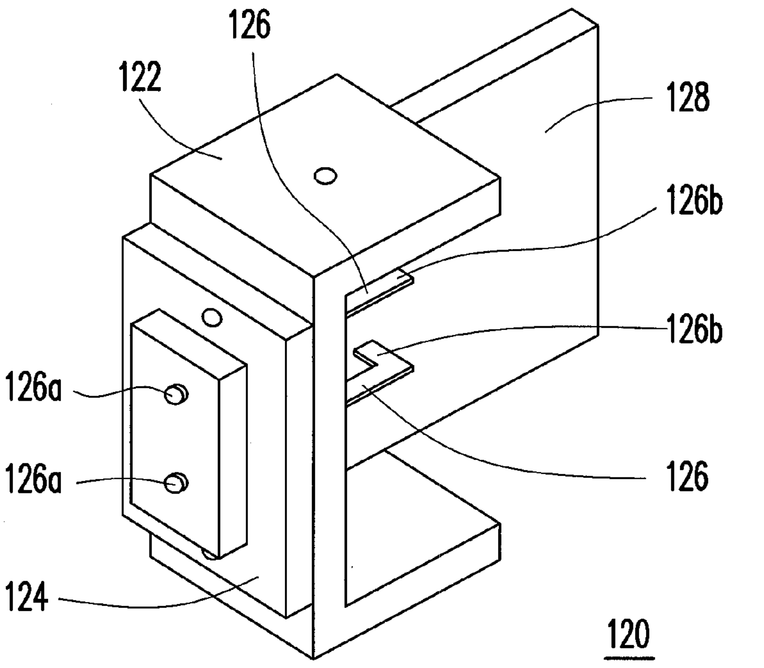
FIG. 3 is a three-dimensional view of a power supply module of FIG. 1.

FIG. 1 is a partial three-dimensional view of a power supply device according to an embodiment of the present invention. FIG. 2 is an exploded view of the power supply device of FIG. 1. FIG. 3 is a three-dimensional view of a power supply module of FIG. 1. Referring to FIGS. 1-3, the power supply device 100 of the present invention can be used in a personal computer, a server or other electronic devices, and the power supply device 100 includes a casing 110 and a power supply module 120.

The casing 110 has an opening 112. The power supply module 120 includes a frame 122, a pin base 124, a plurality of pins 126 (two pins 126 are illustrated) and a printed circuit board 128. The frame 122 is detachably assembled in the casing 110. The pin base 124 is fixed at the frame 122 and is exposed by the opening 112. The pins 126 are fixed at the pin base 124, and first ends 126*a* of the pins 126 are exposed in the opening 112, so as to electrically connect an external circuit (not shown). The printed circuit board 128 is disposed in the casing 110 and is electrically connected to second ends 126*b* of the pins 126.

According to the above configuration, the frame 122, the pin base 124, the pins 126 and the printed circuit board 128 that are assembled to form the power supply module 120 can be altogether assembled to or disassembled from the casing 110, so that an assembling/disassembling convenience is improved. In detail, when the structure is assembled, the pin base 124 and the pins 126 fixed to the pin base 124 can be altogether assembled to the frame 122, and then the pins 126 are electrically connected to the printed circuit board 128 to form the power supply module 120 shown in FIG. 3. Then, the power supply module 120 is installed in the casing 110 by assembling the frame 122 to the casing 110, and meanwhile the pin base 124 and the first ends 126*a* of the pins 126 are exposed in the opening 112 of the casing 110, so as to complete the assembling (as that shown in FIG. 1).

On the other hand, when the power supply device 100 is required to be disassembled, the frame 122 can be disassembled from the casing 110, so as to separate the power supply module 120 from the casing 110. In other words, only the frame 122 is required to be assembled to or disassembled from the casing 110, and the power supply module 120 can be installed in or separated from the casing 110. Referring to FIG. 1, in the present embodiment, when the power supply module 120 is assembled to the casing 110, the pin base 124 is inlaid to the opening 112, so that the whole structure can be more stable.

The frame 122 of the present embodiment is, for example, assembled to the casing 110 through a screwing approach, though the present invention is not limited thereto, and in other embodiments, the frame 122 can also be detachably assembled to the casing 110 through other approaches. Moreover, the pin base 124 of the present embodiment can also be fixed to the frame 122 through the screwing approach, though the present invention is not limited thereto, and in other embodiments, the pin base 124 can be fixed to the frame 122 through other approaches.

Figure 4:
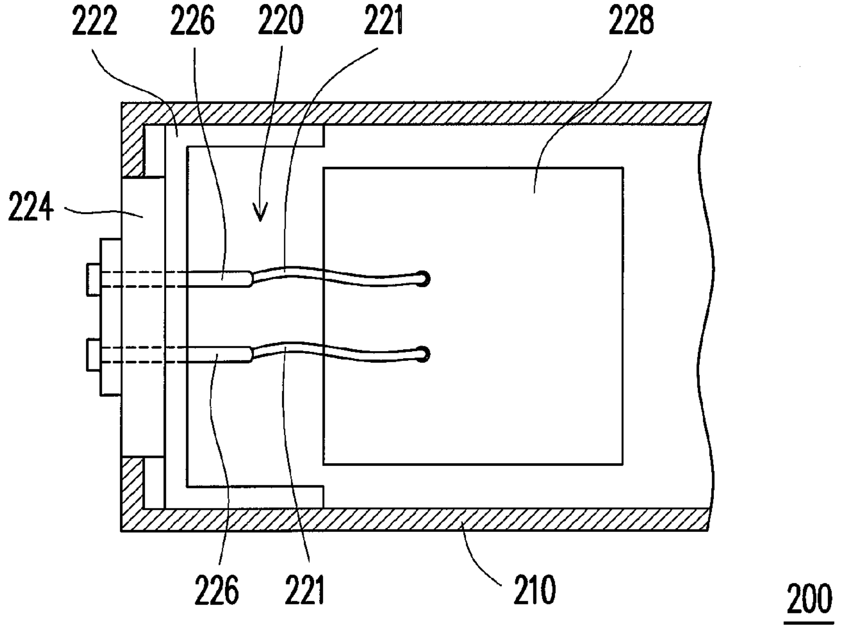
FIG. 4 is a partial cross-sectional view of a power supply device according to another embodiment of the present invention.

Referring to FIG. 2, in detail, the frame 122 of the present embodiment is located between the pin base 124 and the printed circuit board 128, and has an opening slot 122*a*, and the pins 126 penetrate through the opening slot 122*a* to electrically connect the printed circuit board 128 as that shown in FIG. 3 (the opening slot 122*a* is not shown in FIG. 3). The pins 126 of the present embodiment are, for example, welded to the printed circuit board 128 (as shown in FIG. 1), though the present invention is not limited thereto. FIG. 4 is a partial cross-sectional view of a power supply device according to another embodiment of the present invention. Referring to FIG. 4, in the power supply device 200 of the present invention, besides a frame 222, a pin base 224, a plurality of pins 226 (two pins 226 are illustrated) and a printed circuit board 228, a power supply module 220 assembled to a casing 210 further includes a plurality of wires 221 (two wires 221 are illustrated), and the pins 226 are electrically connected to the printed circuit board 228 through the wires 221.

In summary, in the power supply device of the present invention, the pin base is fixed at the frame, and the pins fixed to the pin base penetrate through the frame to connect the printed circuit board, and the frame is detachably assembled in the casing. Therefore, by assembling/disassembling the frame to/from the casing, the power supply module including the pin base, the pins, the frame and the printed circuit board can be assembled/separated to/from the casing, so as to improve an assembling/disassembling convenience. Moreover, when the power supply module is assembled to the casing of the power supply device, the pin base can be inlaid to the opening of the casing, so that a whole structure thereof can be more stable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply device, comprising:
a casing, having an opening;
a power supply module, comprising:
a frame, detachably assembled to the casing and located in the casing;
a pin base, fixed at the frame and exposed by the opening;
a plurality of pins, fixed at the pin base, and first ends of the pins being exposed in the opening; and
a printed circuit board, disposed in the casing and electrically connected to second ends of the pins, wherein the frame and the printed circuit board are located at the same side of the opening, and the frame is adapted to be disassembled from the casing and moved in the casing, so as to separate the power supply module from the casing.

2. The power supply device as claimed in claim 1, wherein the pins are welded to the printed circuit board.

3. The power supply device as claimed in claim 1, wherein the power supply module further comprises a plurality of wires, and the pins are electrically connected to the printed circuit board through the wires.

4. The power supply device as claimed in claim 1, wherein the frame is located between the pin base and the printed circuit board and has an opening slot, and the pins penetrate through the opening slot to electrically connect the printed circuit board.

5. The power supply device as claimed in claim 1, wherein the pin base is inlaid to the opening.

6. A power supply module, adapted to a power supply device, wherein the power supply device comprises a casing having an opening, the power supply module comprising:
a frame, detachably assembled to the casing and located in the casing;
a pin base, fixed at the frame and exposed by the opening;
a plurality of pins, fixed at the pin base, and first ends of the pins being exposed in the opening; and
a printed circuit board, disposed in the casing and electrically connected to second ends of the pins, wherein the frame and the printed circuit board are located at the same side of the opening, and the frame is adapted to be disassembled from the casing and moved in the casing, so as to separate the power supply module from the casing.

7. The power supply module as claimed in claim 6, wherein the pins are welded to the printed circuit board.

8. The power supply module as claimed in claim 6, further comprising a plurality of wires, wherein the pins are electrically connected to the printed circuit board through the wires.

9. The power supply module as claimed in claim 6, wherein the frame is located between the pin base and the printed circuit board and has an opening slot, and the pins penetrate through the opening slot to electrically connect the printed circuit board.

10. The power supply module as claimed in claim 6, wherein the pin base is inlaid to the opening.

* * * * *